United States Patent [19]

Kagey

[11] Patent Number: 5,083,049
[45] Date of Patent: Jan. 21, 1992

[54] ASYNCHRONOUS CIRCUIT WITH EDGE-TRIGGERED INPUTS

[75] Inventor: Lane O. Kagey, Costa Mesa, Calif.

[73] Assignee: AST Research, Inc., Irvine, Calif.

[21] Appl. No.: 698,718

[22] Filed: May 10, 1991

[51] Int. Cl.$^5$ .............................................. H03L 7/06
[52] U.S. Cl. .................... 307/480; 307/601; 307/272.2; 307/272.1
[58] Field of Search ................. 307/480, 272.1, 272.2, 307/601, 265, 266, 267

[56] References Cited

U.S. PATENT DOCUMENTS

| | | | |
|---|---|---|---|
| 4,380,083 | 4/1983 | Andersson et al. | 307/480 |
| 4,851,710 | 7/1989 | Grivna | 307/480 |
| 4,873,456 | 10/1989 | Oliser et al. | 307/272.2 |
| 4,965,465 | 10/1950 | Denda | 307/265 |

Primary Examiner—Stanley D. Miller
Assistant Examiner—Scott A. Ouellette
Attorney, Agent, or Firm—Knobbe, Martens, Olson & Bear

[57] ABSTRACT

An asynchronous circuit utilizes toggle flip-flops to receive a plurality of asynchronous input signals. The input signals are applied to the edge-triggered clock inputs of the toggle flip-flops so that outputs of the toggle flip-flops and other logic signals within the asynchronous circuit change with respect to particular edges of the input signals. An output signal is responsive to the changes in the outputs of the toggle flip-flops and is thus responsive to the changes in the asynchronous input signals. Since the input signals have well-defined transitions which cause the changes in the output signals, various parameters, such as propagation delays, can be measured and characterized. The asynchronous logic circuit thus provides the operational advantages of asynchronous circuits while exhibiting the testability characteristics of clocked logic circuits.

8 Claims, 10 Drawing Sheets

ASYNCHRONOUS CIRCUIT WITH EDGE-TRIGGERED INPUTS

BACKGROUND OF THE INVENTION

1. Field of the Invention

The present invention is in the field of digital logic circuits.

2. Description of the Related Art

Generally, digital computer systems operate on a synchronous basis. That is, the logic circuits within the computer system are clocked logic circuits that are responsive to a common clock signal so that output signals generated by a first logic circuit within the computer system change at predictable times with respect to the common clock signal. Thus, a second logic circuit receiving an output signal from the first logic circuit can gate the output signal at a particular time with respect to the common clock signal when it can be assured that the output signal is stable (e.g., has reached one of two binary states, for example, and has been at that state for a sufficient amount of time that the second logic circuit will detect the correct logic level).

Clocked logic circuits are particularly advantageous for testing purposes. Since the signals into and out of a clocked logic circuit change with respect to a clock signal, the circuit can be tested by applying input signals to it with varying times with respect to the clock signal to determine the setup and hold requirements for the input signals, i.e., how long an input signal has to be stable prior to a change in the clock signal (setup time), and how long an input signal has to remain stable after a clock signal (hold time). In addition, propagation delay through the clocked logic signal can be determined by measuring when an output signal changes with respect to the clock signal that caused the change. These parameters and other parameters can be measured under various operating conditions (e.g., voltage levels, temperatures, etc.) to characterize the clocked logic circuits so that a designer will have knowledge of the parameters when designing systems utilizing the clocked logic circuits. Further, during production, the clocked logic circuits can be readily tested to determine whether the circuits operate in accordance with the known characteristics, or whether the circuits are defective.

There are many advantages to clocked logic circuits that operate in synchronism with a clock; however, there are a number of circumstances where a clocked logic circuit cannot be used and logic circuits must be utilized which operate asynchronously with respect to each other. An input signal to an asynchronous circuit may change at unpredictable times with respect to other logic functions within the asynchronous circuit. For example, a clocked logic component in a computer system may initiate an asynchronous command to an asynchronous circuit and then wait for the asynchronous circuit to respond to the command. The asynchronous circuit may respond with an output signal that is asynchronous to the command from the clocked logic component. Such asynchronous communications are necessary for many applications and serve a number of useful purposes; however, because of the asynchronous nature of the asynchronous circuit, it is difficult to test the asynchronous circuit and characterize its operating parameters since there is no common system clock to which the input signals and output signals can be compared. This is particularly true if the asynchronous circuit is incorporated into a large scale integrated circuit (LSI) such as an application specific integrated circuit (ASIC) which are presently used in a substantial number of new computer systems. Although it is possible to test such asynchronous circuits using specially devised testers or manual techniques, the thorough testing of asynchronous circuits using conventional parametric testing systems has not been readily available. Thus, a need exists for a logic circuit that provides the benefits of an asynchronous circuit (e.g., the ability to operate without a common clock) and that also provides the testability characteristics of a clocked logic circuit.

SUMMARY OF THE INVENTION

The present invention is an improved asynchronous circuit that provides the operational characteristics of an asynchronous circuit but which provides the testability of a clocked logic circuit. That is, the inputs to the asynchronous circuit operate such that a logic function within the circuit begins operation on a predetermined edge of a first input signal and ends on a predetermined edge of a second input signal. The input signals thus function as "clocks" to the asynchronous circuit such that the changes in an output signal responsive to changes in the input signals can be measured with respect to the changes.

The present invention provides a circuit that receives asynchronous input signals and generates an active asynchronous output signal. The circuit comprises a first toggle flip-flop having a first enable input, a first clock input, and a first output which changes logic states upon occurrence of a predetermined edge of a first asynchronous input signal applied to the first clock input only when enabled by a first enable signal applied to the first enable input. The circuit further comprises a second toggle flip-flop having a second enable input, a second clock input, and a second output which changes logic states upon occurrence of a predetermined edge of a second asynchronous input signal applied to the second clock input only when enabled by a second enable signal applied to the second enable input. A logic circuit is responsive to the outputs of the flip-flops and controls the logic level of the first and second enable signals of the flip-flops such that the first flip-flop is enabled prior to occurrence of the predetermined edge of the first asynchronous input signal and disabled after occurrence of the predetermined edges of the first asynchronous input signal. The second flip-flop is disabled until occurrence of the predetermined edge of the first asynchronous input signal and enabled after occurrence of the predetermined edge of the first asynchronous input signal. The second flip-flop is subsequently disabled and the first flip-flop enabled upon occurrence of the predetermined edge of the second asynchronous input signal. The logic circuit further generates the active asynchronous output signal between the predetermined edge of the first asynchronous input signal and the predetermined edge of the second asynchronous input signal. A reset signal may be applied to a reset input of the first and second flip-flops to initialize the circuit, wherein the reset signal enables the first flip-flop and disables the second flip-flop.

A further embodiment of the invention includes a third toggle flip-flop in addition to the first and second toggle flip-flops. After initialization of the circuit, only the first asynchronous input signal will cause the asynchronous output signal to be active, after which the second asynchronous input signal alternates with a third asynchronous input signal to cause the asynchronous output signal to be inactive. A reset signal may be applied to a reset input of the flip-flops to initialize the circuit, wherein the reset signal enables the first flip-flop and disables the second and third flip-flops.

Yet another embodiment of the invention includes third and fourth toggle flip-flops, in addition to the first and second toggle flip-flops described above. After initialization of the circuit, either the first asynchronous input signal or a third asynchronous input signal will cause the asynchronous output signal to be active. If the first asynchronous input signal causes the asynchronous output signal to be active, then only the second asynchronous input signal can cause the asynchronous output signal to be deactivated. On the other hand, if the third asynchronous input signal causes the asYnchronous output signal to be active, then only a fourth asynchronous input signal can cause the asynchronous output signal to be inactive. Again, a reset signal may be applied to a reset input of the flip-flops, wherein the reset signal enables the first and third flip-flops, and disables the second and fourth flip-flops.

A fourth embodiment of the present invention includes a third toggle flip-flop in addition to the first and second toggle flip-flops. An output signal is activated by a predetermined edge of a first signal applied to the first flip-flop. A mode selection signal determines whether a predetermined edge of a second signal applied to the second flip-flop or a predetermined edge of a third signal applied to the third flip-flop deactivates the output signal.

DETAILED DESCRIPTION OF THE PREFERRED EMBODIMENTS

Figure 1:
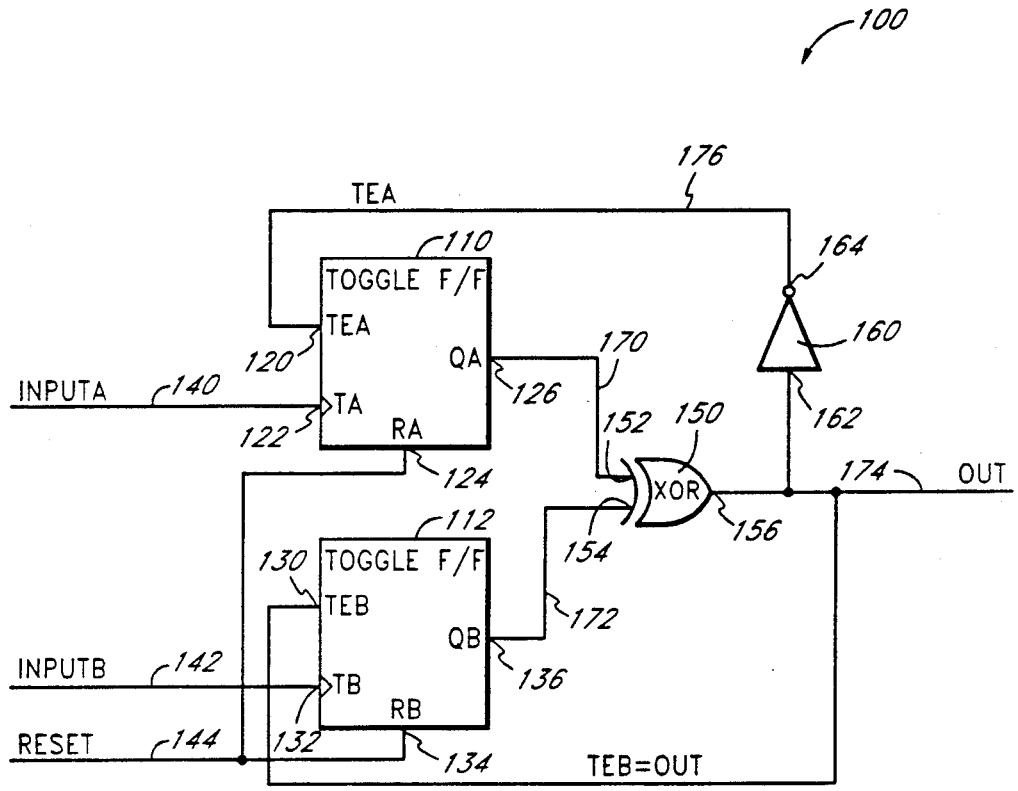
FIG. 1 illustrates a logic diagram of a first embodiment of the present invention which is responsive to a first input signal to activate an output signal and responsive to a second input signal to deactivate the output signal.

FIG. 1 illustrates a logic diagram of a circuit 100 in accordance with the present invention. As will be described below, the circuit 100 of FIG. 1 provides a glitch-free output signal based on multiple asynchronous input signals.

The circuit 100 comprises a first flip-flop 110 and a second flip-flop 112. The two flip-flops 110, 112 are illustrated as toggle flip-flops. For example, the two flip-flops 110, 112 are available as integrated circuits. It should be understood that the flip-flops 110, 112 can advantageously be embodied as part of a programmable array logic (PAL) circuit, an application specific integrated circuit (ASIC), or the like.

As illustrated, the first flip-flop 110 has a toggle enable input (TEA) 120, a clock (i.e., trigger, toggle) input (TA) 122, a reset input (RA) 124, and a true data output (QA) 126. The second flip-flop 112 has a toggle enable input (TEB) 130, a clock input (TB) 132, a reset input (RB) 134, and a true data output (QB) 136. The operation of the first toggle flip-flop is well known in the art. For example, when the toggle enable signal on the TEA input 120 of the first flip-flop 110 is high, the rising edge of a signal on the TA input 122 causes the QA output 126 to change states (i.e., to toggle from a high state to a low state or to toggle from a low state to a high state). When the TEA input is high, each successive rising edge of the clock signal TA will toggle the output QA. When the TEA input 120 is low, the QA output 126 will not change state irrespective of logic state changes on the TA input 122. The reset input RA 124 is an active high signal input that can be used to initialize the flip-flop to a known state by forcing the QA output 126 to a low logic level. The second flip flop 112 operates in the same manner. An exemplary toggle flip-flop will be described below in connection with FIGS. 3 and 4.

As further illustrated in FIG. 1, an INPUTA signal is provided as the input to the TA input 122 of the first flip-flop 110 via an input signal line 140. An INPUTB signal is provided as the input to the TB input 132 of the second flip-flop 112 via an input signal line 142. A RESET input signal is provided as the input to the RA input 124 of the first flip-flop 110 and the RB input 134 of the second flip-flop 112 via an input signal line 144.

The circuit 100 of FIG. 1 further includes a two-input exclusive-OR (XOR) gate 150 having a first input 152, a second input 154 and an output 156, and includes an inverter 160 having an input 162 and an output 164. The QA output 126 of the first flip-flop 110 is connected to the first input 152 of the XOR-gate 150 via a signal line 170. The QB output 136 of the second flip-flop 112 is connected to the second input 154 of the XOR-gate 150 via a signal line 172.

An OUT signal is generated as the output 156 of the XOR-gate 150 on an OUT signal line 174. The OUT signal 174 is connected to the TEB input 130 of the second flip-flop 112. The OUT signal 174 is further connected to the input 162 of the inverter 160. The output 164 of the inverter 160 is the TEA signal connected to the TEA input 120 of the first flip-flop 110 via a signal line 176.

Figure 2:
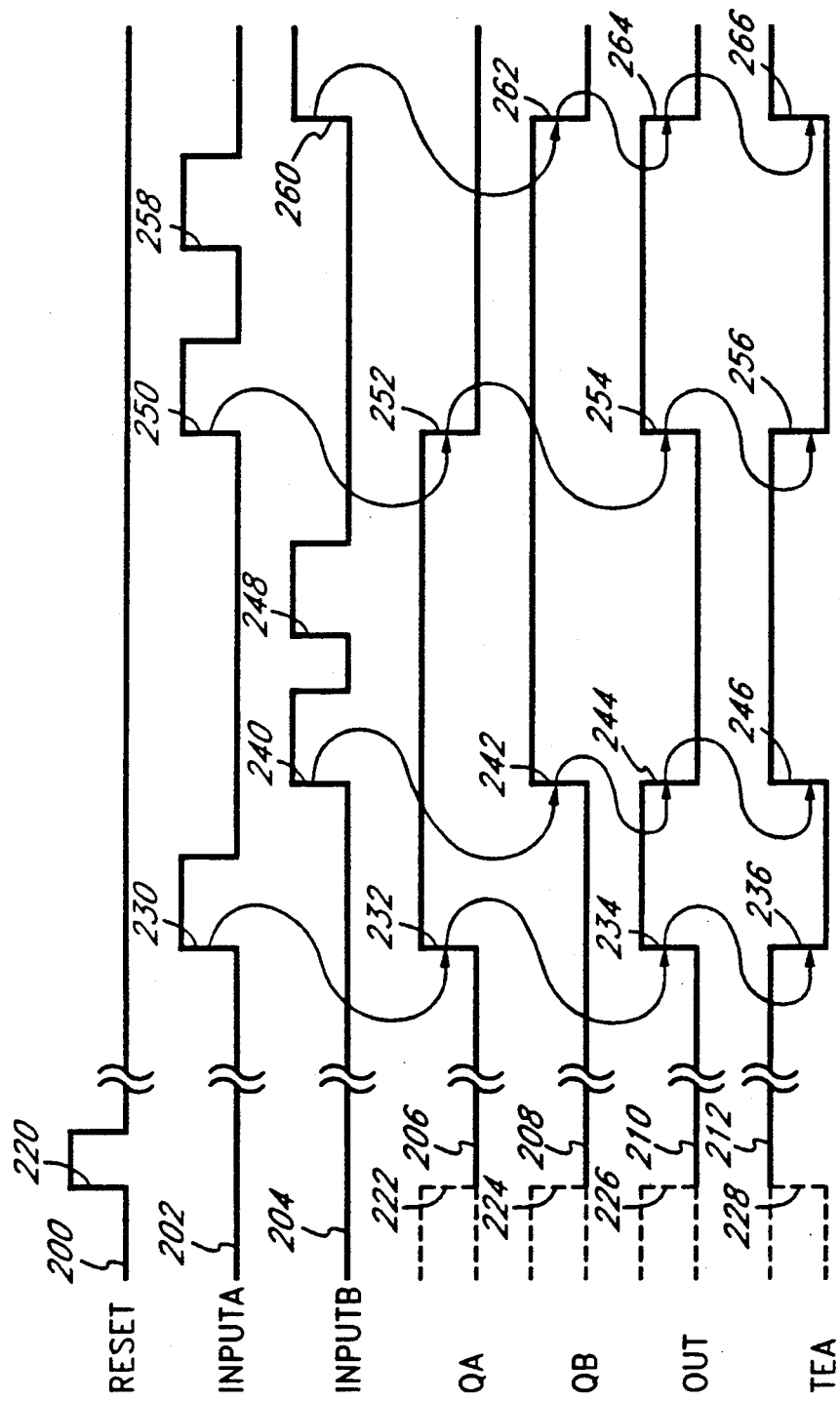
FIG. 2 illustrates timing diagrams of signals associated with the embodiment of Figure showing the relationship between the input signals and the output signal.

The operation of the circuit 100 is illustrated in FIG. 2 by a RESET timing diagram 200 that represents the signal on the RESET input signal line 144, an INPUTA timing diagram 202 that represents the signal on the INPUTA input signal line 140, an INPUTB timing diagram 204 that represents the signal on the INPUTB input signal line 144, a QA timing diagram 206 that represents the signal on the QA signal line 170, a QB timing diagram 208 that represents the signal on the QB signal line 172, an OUT timing diagram 210 that represents the signal on the OUT signal line 174 (also the TEB input signal), and a TEA timing diagram 212 that represents the signal on the TEA signal line 176.

As illustrated by the timing diagram 200, the reset input signal RESET is a pulse that begins with a low-to-high transition 220. This transition initializes the flip-flop 110 to a known state by forcing the QA signal low irrespective of its previous logic state (as illustrated by a transition 222 on the timing diagram 206). In the same manner, the flip-flop 112 is initialized by forcing the QB signal low irrespective of its previous logic state (as illustrated by a transition 224 on the timing diagram 204). This causes both inputs of the XOR-gate 150 to be forced low. Thus, the OUT signal is forced low irrespective of the previous logic state (as illustrated by a transition 226 on the timing diagram 210). The low OUT signal forces the inverter output TEA signal high irrespective of its previous logic state (as illustrated by a transition 228 on the timing diagram 212). The RESET signal operates to initialize both flip-flops 110, 112 to known states and to initialize the OUT signal to a known low state.

After the circuit has been initialized by the RESET pulse, either asynchronous signal input INPUTA or asynchronous signal input INPUTB may go active with a low-to-high transition. However, a change on INPUTB will not toggle the QB signal line since the OUT signal and thus the TEB input are at a low state (i.e., the second flip-flop 112 is not enabled to toggle). On the other hand the TEA input is at a high level after the RESET pulse. Therefore when a low-to-high transition of the INPUTA signal occurs (as illustrated by a transition 230 on the timing diagram 202), the QA signal line responds with a low-to-high transition (as illustrated by a transition 232 on the timing diagram 206). The first input 152 of the XOR-gate 150 now has a high logic level and the second input 154 has a low logic level. Therefore, since the two inputs are different, the output 156 of the XOR-gate 150 will go high. Thus the OUT signal has a low-to-high transition (as illustrated by a transition 234 on the timing diagram 210). The OUT signal change causes the output 164 of the inverter 160 to have a high-to-low transition on the TEA signal (as illustrated by a transition 236 of the timing diagram 212). The curved lines with arrowheads between the timing diagrams show a cause and effect relationship with an implied propagation delay at the arrowhead end of the lines.

At this time, the first flip-flop !10 will be disabled since the TEA input is at a low level and the QA signal line 170 remains at a high state. The second flip-flop 112 is enabled since the TEB input 130 is at a high level. Therefore, a low-to-high transition of the INPUTB input signal (as illustrated by a transition 240 on the timing diagram 204) causes a low-to-high transition of the QB signal (as illustrated by a transition 242 on the timing diagram 208). The first input 152 of the XOR-gate 150 remains at a high logic level and the second input 154 now goes to a high logic level, so the OUT signal has a high-to-low transition (as illustrated by a transition 244 on the timing diagram 210). The OUT signal change causes the output of the inverter 160 to have a low-to-high transition on the TEA signal (as illustrated by a transition 246 of the timing diagram 212).

At this time, the second flip-flop 112 is disabled since the TEB input 130 is at a low logic level. Therefore, when a subsequent low-to-high transition occurs on the INPUTB signal (as illustrated by a transition 248 on the timing diagram 204), the output QB will not change logic state. However, the first flip-flop 110 is enabled since the TEA input 120 is at a high logic level and responds to a subsequent low-to-high transition on the INPUTA signal (as illustrated by a transition 250 on the timing diagram 202) by toggling high-to-low on the QA signal (as illustrated by a transition 252 on the timing diagram 206). Since the two inputs of the XOR-gate 150 are now at opposite logic levels, the OUT signal is set high (as illustrated by transition 254 on the timing diagram 210) and causes the TEA output of the inverter 160 to go low (as illustrated by a transition 256 on the timing diagram 212). Another low-to-high transition on the INPUTA signal (as illustrated by a transition 258 on the timing diagram 202) will not toggle the QA signal line since the TEA input is at a low logic level.

The second flip-flop 112 is now enabled since the OUT signal and thus the TEB input 130 are both at a high logic level. When the INPUTB signal has a low-to-high transition (as illustrated by a transition 260 on the timing diagram 204), the QB signal toggles with a high-to-low transition (as illustrated by a transition 262 on the timing diagram 208). Both inputs to the XOR-gate 160 are at a low logic level so the OUT signal goes to a low logic level (as illustrated by a transition 264 on timing diagram 210) and causes the inverter 160 output TEA to go to a high logic level (as illustrated by a transition 266 on the timing diagram 212).

Thus it can be seen, in summary, that the signal INPUTA initiates a change in the logic state of the OUT signal and that additional logic pulses on the INPUTA signal line will not have any effect until the INPUTB signal changes the state of the OUT signal. This enables the circuit comprising the two flip-flops 110, 112 to be used with asynchronous signals having multiple transitions. Further, since the OUT signal is directly derived from transitions on the clocked inputs of the two flip-flops 110, 112, the circuit is readily testable using conventional testing techniques.

One skilled in the art will appreciate that if the INPUTA signal and the INPUTB signal change within an extremely short time span with respect to each other, it is possible that the circuit of FIG. 1 (and the circuits to be described below) may enter an unknown state. As with almost any clocked logic circuit, certain minimum setup and hold time requirements must be met. For example, the INPUTB signal should not change following a change in the INPUTA signal until a sufficient time has elapsed to permit the Q output signal of the first flip-flop 110 to propagate to the output and thus to the toggle input of the second flip-flop 112 and to satisfy the setup time of the second flip-flop 112. The amount of time required will depend upon the technology in which the circuit is implemented.

Figure 3:
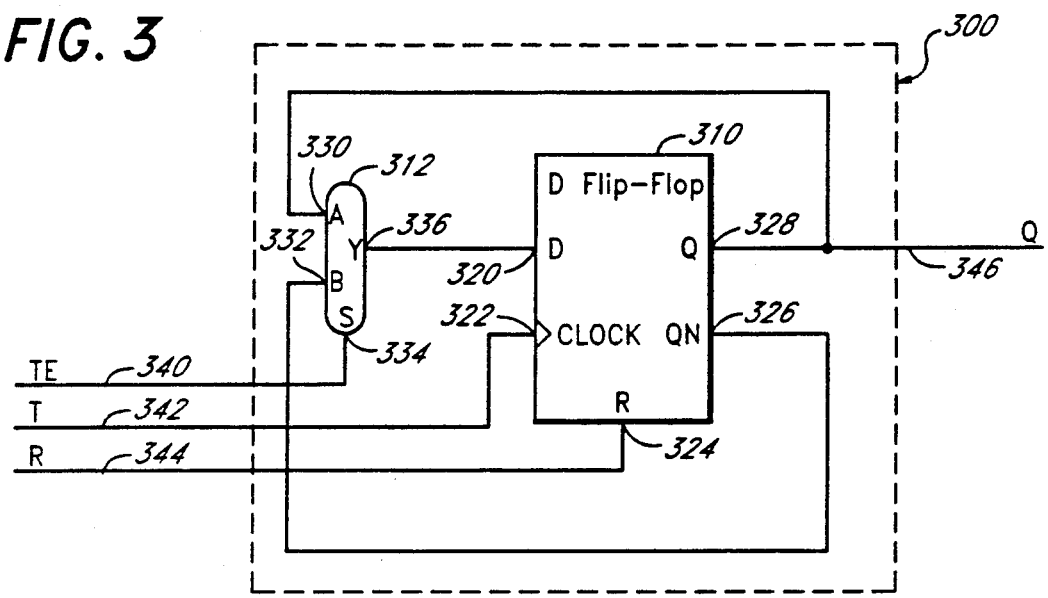
FIG. 3 illustrates a first embodiment of a toggle flip-flop that can be incorporated into the embodiments of the present invention.

FIG. 3 illustrates a logic diagram of a circuit 300 that is an implementation of the toggle flip-flops 110, 112. The circuit 300 comprises a flip-flop 310 and a 2-input multiplexer 312. The flip-flop is illustrated as a D-type flip-flop such as a 7474 integrated circuit or an equivalent integrated circuit available from a number of integrated circuit manufacturers.

As illustrated, the flip-flop 310 has a data input (D) 320, a CLOCK (i.e., toggle, trigger) input 322, a reset input (R) 324, an active low data output (QN) 326, and an active high data output (Q) 328. The 2-input multiplexer 312 has a first data input (A) 330, a second data input (B) 332, a select input (S) 334, and a data output (Y) 336. A TE (toggle enable) signal is provided to the S input 334 of the multiplexer 312 via an input signal line 340. A T (toggle) signal is provided to the CLOCK input 322 of the flip-flop 310 via an input signal line 342, and an R (reset) signal is provided to the R input 324 via an input signal line 344. A Q signal is provided from the Q output 328 of the flip-flop 310 via an output signal line 346. The Q signal 346 is further connected to the A input 330 of the multiplexer 312. The QN output 326 of flip-flop 310 is connected to the B input 332 of the multiplexer 312. The Y output 336 of the multiplexer 312 is connected to the D input 320 of the flip-flop 310.

The reset input R 324 is used to initialize the flip-flop to a known state by forcing the Q output 328 to a low logic level and the QN output 326 to a high logic level. As a result, the A input 330 of multiplexer 3!2 has a low logic level and the B input 332 has a high logic level. While the TE input signal 340 is at a low logic level, the multiplexer 312 will gate the A input 330 through to the Y output 336. In this case, the D input 320 will have a low logic level. When a low-to-high transition occurs on the T signal line 342 (and therefore at the CLOCK input 322), the D input data is loaded into the flop-flop and the Q output 328 remains at a low logic level. When the TE input 340 is set to a high logic level, the multiplexer 312 selects the high logic level data at the B input 332 to gate through to the Y output 336. Thus, at the next low-to-high transition of the T signal line 342 the high logic level at the D data input is loaded into the flip-flop 310 and the Q output 328 has a high logic level and the QN output 326 has a low logic level. Therefore, the A input of the multiplexer has a high logic level and the B input has a low logic level. On the next transition of the T input, the low logic level of the B input will be loaded into the flip-flop 310 to cause the Q and QN outputs to again change state. Hence, one skilled in the art will see that while the TE signal on the line 340 remains at a high logic level, the flip-flop outputs will toggle with each low-to-high transition of the T signal 342. On the other hand, when the TE signal is low, the current state of the Q output signal will be loaded into the flip-flop 310, maintaining the current state.

Figure 4:
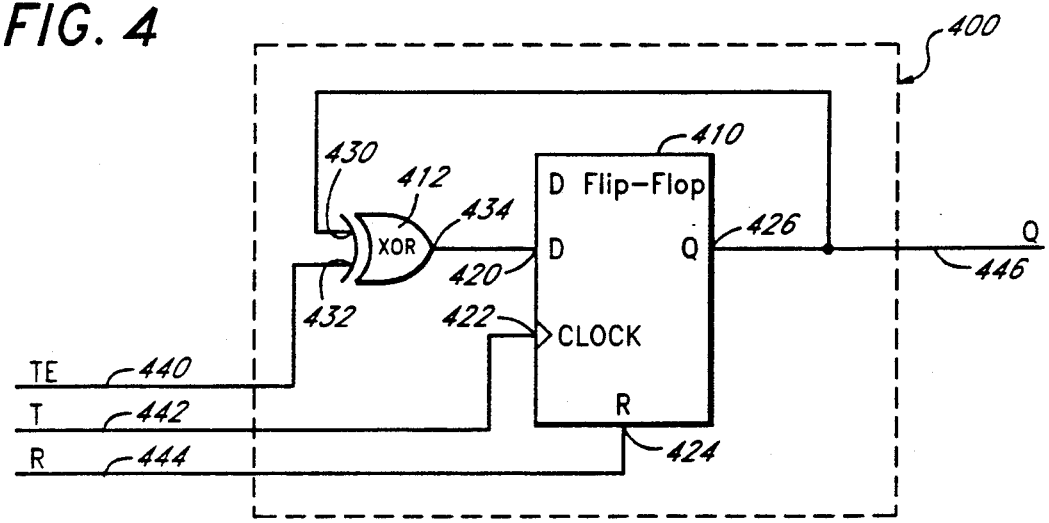
FIG. 4 illustrates an alternative embodiment of a toggle flip-flop that can be incorporated into the embodiments of the present invention

FIG. 4 illustrates a logic diagram of a circuit 400 that is another implementation of a toggle flip-flop. The circuit 400 comprises a flip-flop 410 and a two-input XOR-gate 4!2. The flip-flop is illustrated as a D-type flip-flop such as a 7474 integrated circuit or an equivalent integrated circuit available from a number of integrated circuit manufacturers. As illustrated, the flip-flop 410 has a data input (D) 420, a CLOCK (i.e., toggle, trigger) input 422, a reset input (R) 424, and a high active data output (Q) 426. The XOR-gate 412 has a first data input 430, a second data input 432, and a data output 434. A TE signal is provided to the second input 432 of the XOR-gate 412 via an input signal line 440. A T signal is provided to the CLOCK input 422 of the flip-flop 410 via an input signal line 442 and a R signal is provided to the R input 424 via an input signal line 444. A Q signal is provided from the Q output 426 of the flip-flop 410 via an output signal line 446. The Q signal 446 is further connected to the first input 430 of the XOR-gate 412. The XOR-gate output 434 is connected to the D input 420 of the flip-flop 410.

The reset input R 424 is used to initialize the flip-flop to a known state by forcing the Q output 426 to a low logic level. The first input 430 of the XOR-gate 412 is therefore at a low logic level after initialization. While the TE input signal 440 remains at a low state, the output of the XOR-gate 412 will be the same as the Q output signal on the first input of the XOR-gate 412. Thus, the current state of the Q output will be constantly loaded into the flip-flop 410 on each transition of the T signal on the input 422. On the other hand, when the TE input is high, the XOR-gate 412 operates to invert the Q output signal applied to its first input 430. Thus, the Q output signal of the flip-flop 410 will toggle on each occurrence of the T signal.

Figure 5:
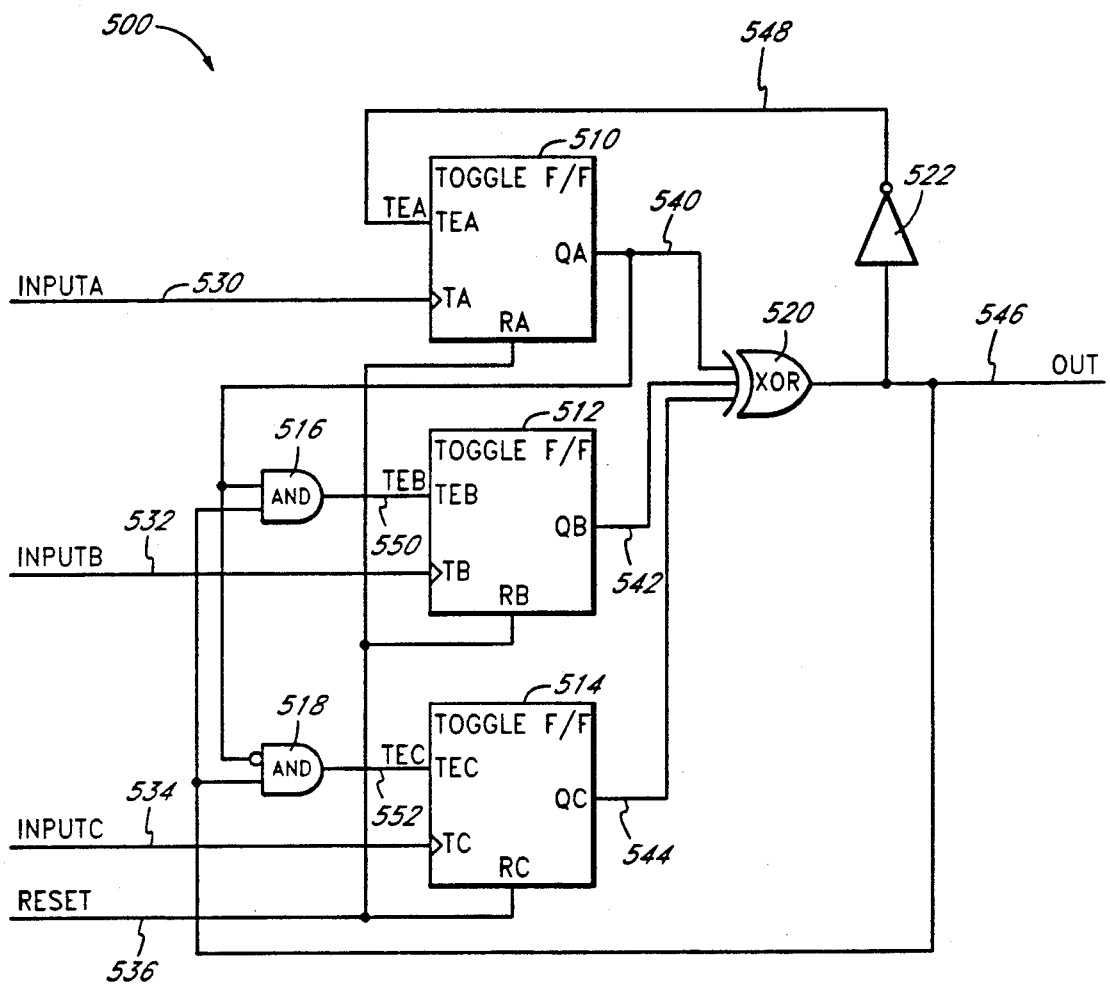
FIG. 5 illustrates a second embodiment of the present invention in which an output signal is activated by a first input and alternately deactivated by a second input and a third input.

FIG. 5 illustrates a logic diagram of an alternative circuit 500 in accordance with the present invention, which is responsive to a first input to change the output from a low to high level and is responsive to one of two other inputs to change the output back to a low level, and subsequently is responsive to the other input to change the output low following the next active output. The circuit 500 comprises a first flip-flop 510, a second flip-flop 512, and a third flip-flop 514. The three flip-flops 510, 512, 514 are illustrated as toggle flip-flops, as described above. The first flip-flop 510 has a toggle enable input TEA, a toggle input TA, a reset input RA, and a QA output. The second flip-flop 512 has a TEB input, a TB input, a RB input, and a QB output. The third flip-flop 514 has a TEC input, a TC input, a RC input and a QC output.

The circuit 500 further includes a first AND-gate 516 having first and second inputs and an output; a second AND-gate 518 having first and second inputs and an output; an exclusive-OR (XOR) gate 520 having first, second, and third inputs and an output; and an inverter 522 having an input and an output. (The three-input exclusive-OR gate 520 may be implemented, for example, by a first two-input exclusive-0R gate to which the first and second inputs are connected and a second two-input exclusive-OR gate which receives the output of the first two-input exclusive-OR gate and the third input. The output of the second two-input exclusive-OR gate is the output of the three-input exclusive-OR gate 520.)

The TA input of the first flip-flop 510 is connected to an INPUTA signal input line 530. The TB input of the second flip-flop 512 is connected to an INPUTB signal input line 532. The TC input of the third flip-flop 514 is connected to an INPUTC signal input line 534. The RA, RB, RC inputs of flip-flops 510, 512, 514, respectively, are all connected to a common RESET signal input line 536.

The QA output of the first flip-flop 510 is connected to the first input of the XOR-gate 520 via a signal line 540. The QA output is further connected to the first input of the AND-gate 516 and to the first input of the AND-gate 518. The QB output of the second flip-flop 512 is connected to the second input of the XOR-gate 520 via a signal line 542. The QC output of the third flip-flop 514 is connected to the third input of the XOR-gate 520 via a signal line 544. The output of the XOR-gate 520 is an OUT signal on an output signal line 546. The OUT signal 546 is connected to the input of the inverter 522 and is further connected to the second input of the first AND-gate 516 and to the second input of the second AND-gate 518. The TEA input of the first flip-flop 510 is connected to the output of the inverter 522 via a TEA signal on a signal line 548. The TEB input of the second flip-flop 512 is connected to the output of the first AND-gate via a TEB signal on a signal line 550. The TEC input of the third flip-flop 514 is connected to the output of the second AND-gate via a TEC signal on a signal line 552.

The two inputs to the first AND-gate 516 are active high so that the output of the first AND-gate 516 will be active high when both inputs are high. The small circle on the first input of the second AND-gate 518 indicates that it is an active low input. Therefore, the second AND-gate will have a high level output when the first input is at a low level and the second input is at a high level. (The active low input can be implemented by including an inverter on a conventional active high input.)

The three-input XOR-gate 520 will have a high level output when it detects an odd number of high level inputs and a low level when it detects an even number of high level inputs.

Figure 6:
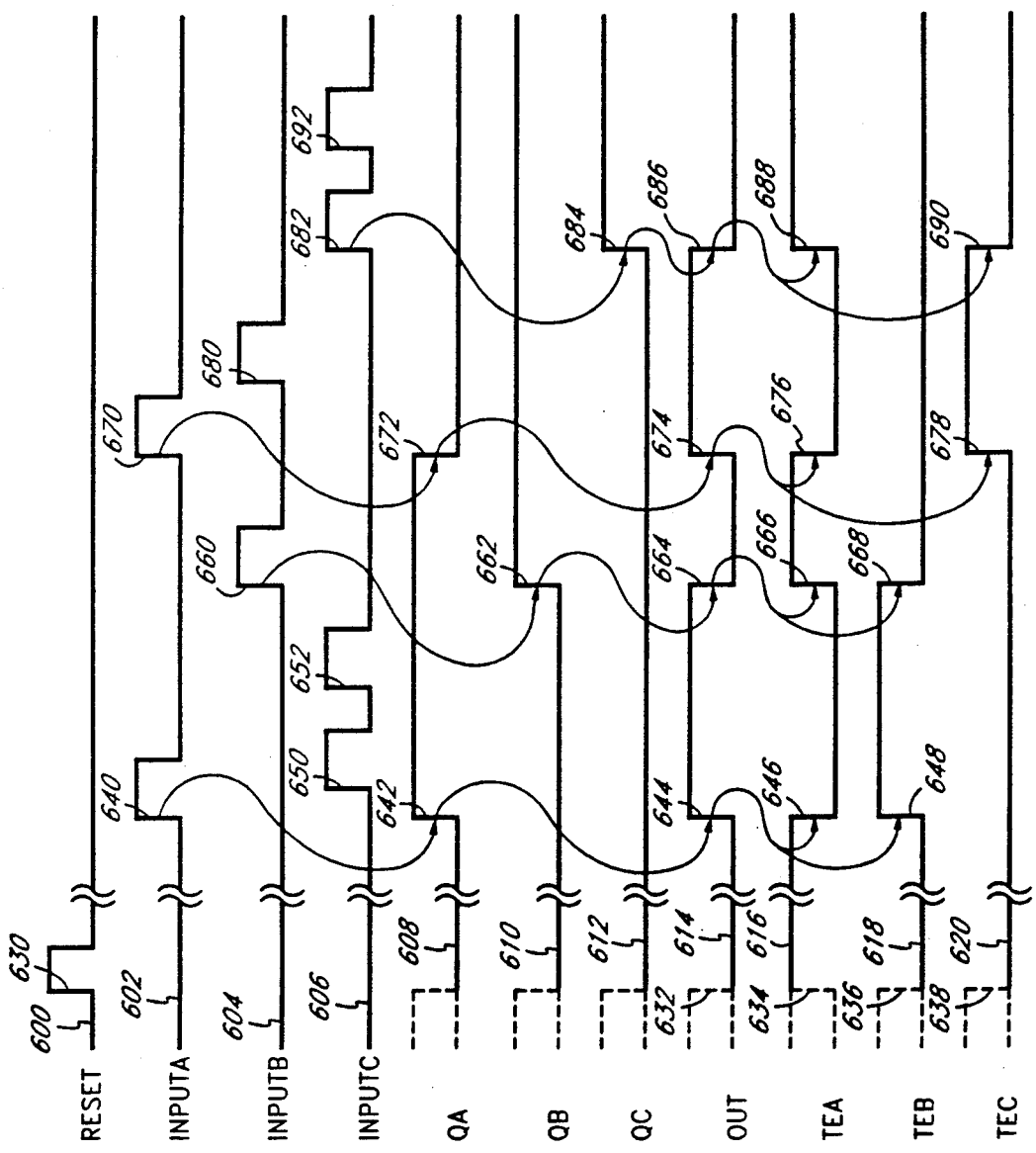
FIG. 6 illustrates timing diagrams of signals associated with the embodiment of FIG. 5 showing the relationship between the input signals and the output signal.

The operation of the embodiment of FIG. 5 in providing the glitch-free output signal OUT is illustrated by the timing diagrams in FIG. 6. Timing diagrams 600, 602, 604, 606, 608, 610, 612, 614, 616, 618, and 620 represent the RESET signal, the INPUTA signal, the INPUTB signal, the INPUTC signal, the QA signal, the QB signal, the QC signal, the OUT signal, the TEA signal, the TEB signal, and the TEC signal, respectively.

As illustrated in FIG. 6, the circuit 500 is initialized by a low-to-high transition of the RESET input signal (transition 630). The first, second and third flip-flop outputs QA, QB, and QC respectively are all forced to a low logic level if they were at a high logic level initially. This causes all three inputs of the XOR-gate 520 to be forced to a low logic level and the output signal on the OUT signal line 546 will be forced low (transition 632) irrespective of its initial state. The low logic level OUT signal drives the inverter output on the signal line TEA 548 high (transition 634) if it was initially low. The low logic level OUT signal causes both the AND-gate outputs TEB and TEC to be forced to a low logic level (transitions 636 and 638, respectively) if they were initially at a high logic level.

After initialization, only the first flip-flop 510 is enabled to toggle in response to an asynchronous input since the TEA signal is at a high logic level and the TEB and TEC signals are at a low logic level. A low-to-high transition on the INPUTA signal line (transition 640) causes a low-to-high transition (transition 642) on the QA output signal line 540 from the first flip-flop 510. The first input of the XOR-gate 520 has a high logic level and the other two inputs remain at a low logic level so the output on the OUT signal line is forced high (transition 644). The high logic level OUT signal causes a high-to-low transition (transition 646) on the TEA signal line 548 from the inverter 522. This disables further transitions on the INPUTA signal line from toggling the first flip-flop 510. Since both the OUT signal and the QA signal are now at a high logic level, the output of the first AND-gate 516 is forced high (transition 648) on the TEB signal line. Thus, the second flip-flop 512 is enabled to toggle in response to an asynchronous input on the INPUTB signal line, but the third flip-flop 514 remains disabled since the TEC input remains at a low logic level. The low-to-high transitions on the INPUTC signal line (transitions 650 and 652) of the third flip-flop are therefore ignored.

When the INPUTB signal has a low-to-high transition (transition 660), the QB signal is forced high (transition 662) forcing the OUT signal to a high-to-low transition (transition 664) since two inputs to the XOR-gate 520 are at a high logic level. The low logic level OUT signal drives the TEA signal to a high logic level (transition 666) and causes the TEB signal to transition to a low logic level (transition 668). Therefore, only the first flip-flop 510 is enabled at this time. When the INPUTA signal has the next low-to-high transition (transition 670), the first flip-flop 510 toggles with a high-to-low transition on the QA output (transition 672). The OUT signal goes to a high logic level (transition 674) since only one input to the XOR-gate 520 is at a high logic level which causes the TEA signal to go to a low logic level (transition 676). The AND-gate 518 now has a low logic level on the first input and a high logic level on the second input so that the TEC signal will go to a high logic level (transition 678). Thus, only the third flip-flop 514 is enabled. A low-to-high transition (transition 680) on INPUTB of the second flip-flop is ignored When a low-to-high transition on the INPUTC signal occurs (transition 682), the QC output goes to a high logic level (transition 684) and causes the OUT signal to go to a low logic level (transition 686) since two inputs to the XOR-gate 520 are at a high logic level. The low logic level OUT signal drives the TEA signal to a high logic level (transition 688) and further drives the TEC output of the AND-gate 518 to a low logic level (transition 690) disabling the third flip-flop 514. A subsequent low-to-high transition on the INPUTC signal line (transition 692) is ignored.

In summary for circuit 500, after initialization only the INPUTA signal will cause the OUT signal to go to a high logic level and then only the INPUTB signal can cause the OUT signal to go to a low logic level. Thereafter, again only the INPUTA signal can cause the OUT signal to go to a high logic level, and only the INPUTC signal causes the OUT signal to return low. The INPUTC signal and the INPUTB signal alternate to force the OUT signal to a low logic level after the INPUTA signal forces the OUT signal to a high logic level.

Figure 7:
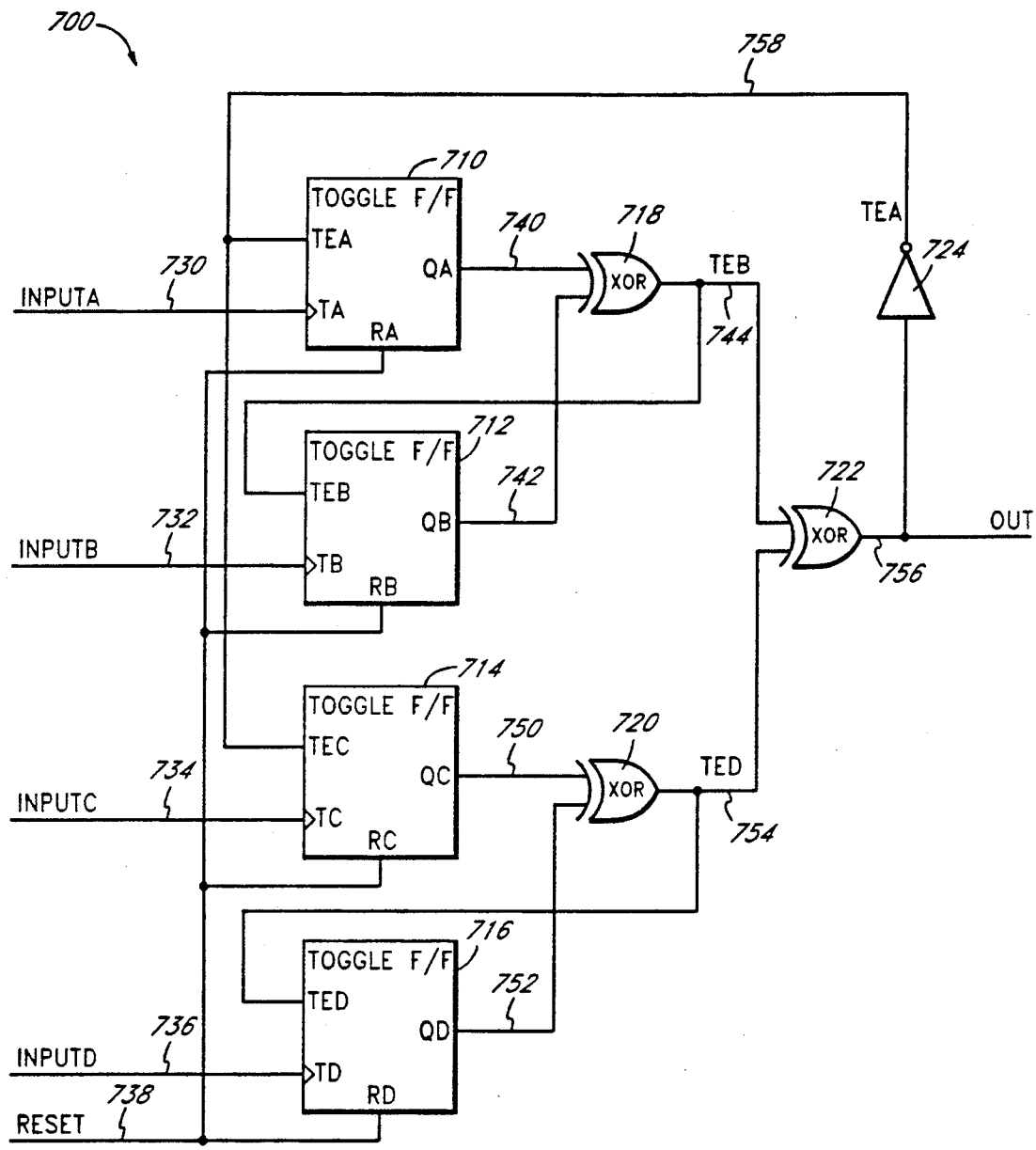
FIG. 7 illustrates a third embodiment of the present invention in which an output signal can be activated by either of two input signals and in which the output signal can only be deactivated by a particular input signal associated with the input signal which activated the output signal.

FIG. 7 illustrates a logic diagram of a circuit 700 in accordance with a further embodiment of the present invention. The circuit 700 comprises a first flip-flop 710, a second flip-flop 712, a third flip-flop 714, and a fourth flip-flop 716. The four flip-flops 710, 712, 714, 716 are illustrated as toggle flip-flops. The first flip-flop 710 has a TEA input, a TA input, a RA input and a QA output. The second flip-flop 712 has a TEB input, a TB input, a RB input and a QB output. The third flip-flop 714 has a TEC input, a TC input, a RC input and a QC output. The fourth flip-flop 716 has a TED input, a TD input, a RD input and a QD output.

The circuit 700 further includes a first XOR-gate 718 having first and second inputs and an output; a second XOR-gate 720 having first and second inputs and an output; a third XOR-gate 722 having first and second inputs and an output; and an inverter 724 having an input and an output.

The TA input of the first flip-flop 710 is connected to an INPUTA signal input line 730. The TB input of the second flip-flop 712 is connected to an INPUTB signal input line 732. The TC input of the third flip-flop 714 is connected to an INPUTC signal input line 734. The TD input of the fourth flip-flop 716 is connected to an INPUTD signal line 736. The RA, RB, RC, RD inputs of flip-flops 710, 712, 714, 716, respectively, are all connected to a common RESET signal input line 738.

The QA output of the first flip-flop 710 is connected to the first input of the first XOR-gate 718 via a signal line 740. The QB output of the second flip-flop 712 is connected to the second input of the first XOR-gate 718 via a signal line 742. The output of the first XOR-gate 718 is connected to the first input of the third XOR-gate 722 via a TEB signal on a signal line 744. The TEB signal line is further connected to the TEB input of the second flip-flop 712. The QC output of the third flip-flop 714 is connected to the first input of the second XOR-gate 720 via a signal line 750. The QD output of the fourth flip-flop 716 is connected to the second input of the second XOR-gate 720 via a signal line 752. The output of the XOR-gate 720 is connected to the second input of the third XOR-gate 722 via a TED signal on a signal line 754. The TED signal line is further connected to the TED input of the fourth flip-flop 716. The output of the third XOR-gate 722 is an OUT signal on an output signal line 756. The OUT signal 756 is connected to the input of the inverter 724. The TEA input of the first flip-flop 710 and the TEC input of the third flip-flop 714 are connected to the output of the inverter 724 via a TEA signal on a signal line 758.

Figure 8:
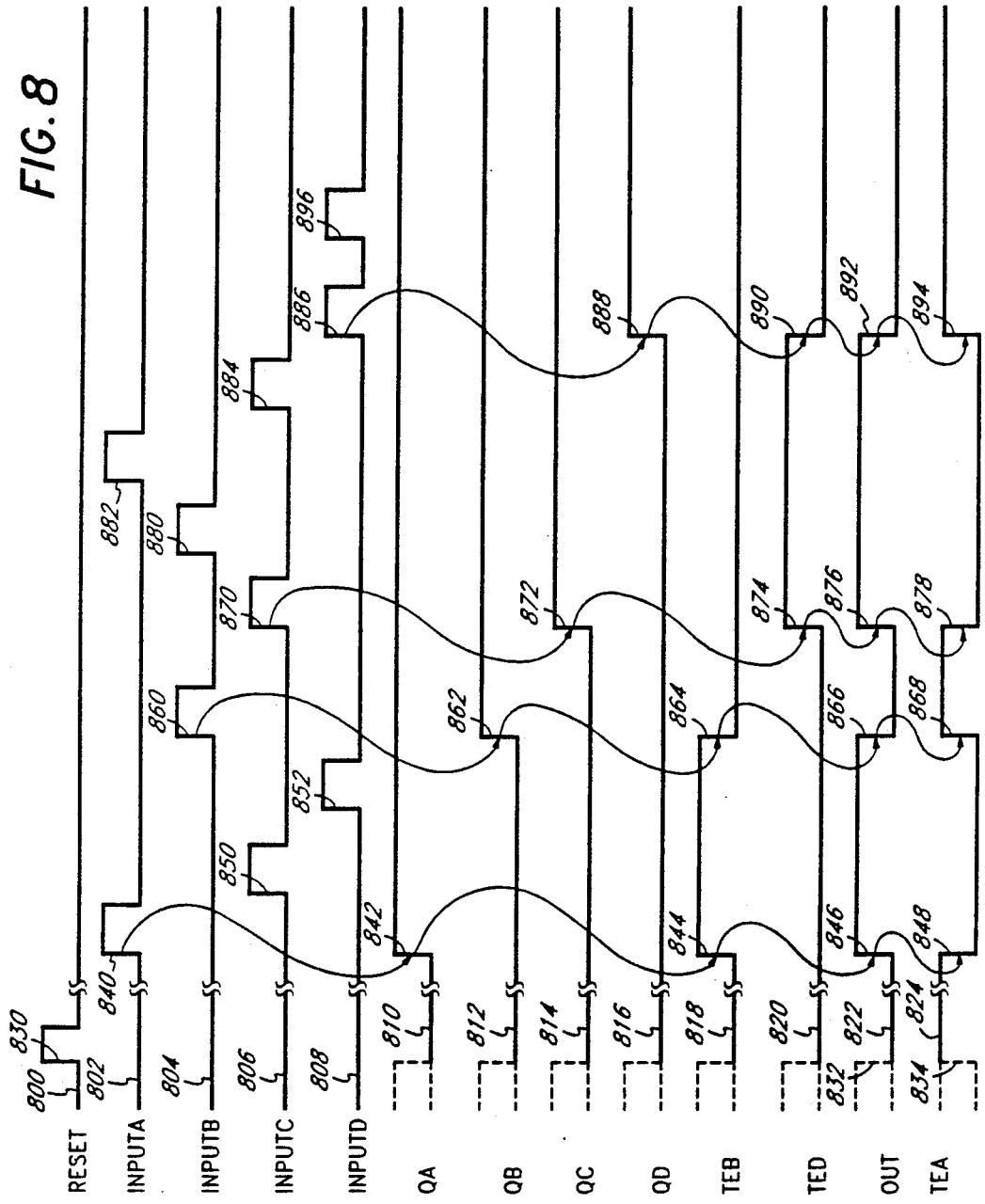
FIG. 8 illustrates timing diagrams of signals associated with the embodiment of FIG. 7 showing the relationship between the input signals and the output signal.

The operation of the embodiment of FIG. 7 in providing the glitch-free output signal OUT is illustrated by the timing diagrams in FIG. 8. Timing diagrams 800, 802, 804, 806, 808, 810, 812, 814, 816, 818, 820, 822, and 824 represent the RESET signal, the INPUTA signal, the INPUTB signal, the INPUTC signal, the INPUTD signal, the QA signal, the QB signal, the QC signal, the QD signal, the TEB signal, the TED signal, the OUT signal, and the TEA signal, respectively.

As illustrated in FIG. 8, the circuit 700 is initialized by a low-to-high transition of the RESET input signal (transition 830). The first, second, third and fourth flip-flop outputs QA, QB, QC, and QD, respectively, are all forced to a low logic level if they were at a high logic level initially. This causes both inputs of the first XOR-gate 718 and both inputs of the second XOR-gate 720 to be forced to a low logic level which further causes both inputs of the third XOR-gate 722 to be forced to a low logic level and the output signal on the OUT signal line 756 will be forced low (transition 832) irrespective of its initial state. The low logic level OUT signal drives the inverter output on the signal line TEA 758 high (transition 834) if it was initially at a low logic level.

After initialization, both the first flip-flop 710 and the third flip-flop 714 are enabled to toggle in response to an asynchronous input since the TEA signal is at a high logic level and the TEB and TED signals are at a low logic level. Therefore, a low-to-high transition on either the INPUTA signal line 730 or the INPUTC signal line 734 would initiate a change of logic state on the OUT signal line 756.

As illustrated in FIG. 8, a low-to-high transition on the INPUTA signal line (transition 840) causes a low-to-high transition (transition 842) on the QA output signal line 740 from the first flip-flop 710. The first input of the first XOR-gate 718 has a high logic level while the second input of the first XOR-gate remains at a low logic level so the output on the TEB signal line is forced high (transition 844). The first input of the third XOR-gate 722 now has a high logic level while the second input of the third XOR-gate remains at a low logic level so the output on the OUT signal line is forced high (transition 846). The high logic level OUT signal causes a high-to-low transition (transition 848) on the TEA signal line 758 from the inverter 724. This disables further transitions on the INPUTA signal line and the INPUTC signal line from toggling the first flip-flop 710 and the third flip-flop 714, respectively. The second flip-flop 712 is enabled to toggle in response to an asynchronous input on the INPUTB signal line, but the fourth flip-flop 716 remains disabled since the TED input remains at a low logic level. The low-to-high transition on the INPUTC signal line (transition 850) to the third flip-flop 714 and on the INPUTD signal line (transition 852) to the fourth flip-flop 716 are therefore ignored.

When the INPUTB signal has a low-to-high transition (transition 860), the QB signal is forced high (transition 862) forcing the TEB signal to a high-to-low transition (transition 864) since both inputs to the first XOR-gate 718 are at a high logic level. The two inputs to the third XOR-gate 722 are both at a low logic level so the OUT signal is forced low (transition 866). The low logic level OUT signal drives the TEA signal to a high logic level (transition 868). Therefore, the first flip-flop 710 and the third flip-flop 714 are enabled at this time.

When the INPUTC signal has the next low-to-high transition (transition 870), the third flip-flop 714 toggles with a low-to-high transition on the QC output (transition 872). The second XOR-gate 720 now has a high logic level on the first input and a low logic level on the second input so the output on the TED signal line is forced high (transition 874). The OUT signal goes to a high logic level (transition 876) since only one input to the third XOR-gate 722 is at a high logic level which causes the TEA signal to go to a low logic level (transition 878). Thus, only the fourth flip-flop 716 is enabled. Low-to-high transitions (transitions 880, 882, 884) on the INPUTB signal line to the second flip-flop 712, on the INPUTA signal line to the first flip-flop 710, and on the INPUTC signal line to the third flip-flop 714, respectively, are ignored When a low-to-high transition on the INPUTD signal occurs (transition 886), the QD output goes to a high logic level (transition 888) and causes the TED signal to go to a low logic level (transition 890) since the two inputs to the second XOR-gate 720 are at a high logic level. Both inputs to the third XOR-gate 722 are then high so the output on the OUT signal line goes to a low logic level (transition 892). The low logic level OUT signal drives the TEA signal to a high logic level (transition 894) enabling the first flip-flop 710 and the third flip-flop 714. A subsequent low-to-high transition on the INPUTD signal line (transition 896) is ignored.

In summary for the circuit 700, after initialization either the INPUTA signal or the INPUTC signal will cause the OUT signal to go to a high logic level. If the INPUTA signal changes the state of the OUT signal, then only the INPUTB signal can cause the OUT signal to go to a low logic level. If the INPUTC signal changes the state of the OUT signal, then only the IN- PUTD signal can cause the OUT signal to go to a low logic level. When the OUT signal is low, either the INPUTA signal or the INPUTC signal can again cause the OUT signal to go to a high logic level.

A further alternative circuit 900 will be described below in FIG. 9 in view of a particularly advantageous use in a memory control circuit; however, other uses for the circuit can be readily envisioned by one skilled in the art. In particular, the circuit 900 is particularly useful for generating the row address select (RAS) signal for a bank of dynamic random access memory (DRAM) wherein the activation of the RAS signal initiates a cycle of the DRAM integrated circuits.

As background information, it should be understood that DRAMs typically are available in a variety of configurations and are also available with a variety of access times (e.g., 80 nanoseconds, 100 nanoseconds, 120 nanoseconds, etc.). Generally, faster DRAMs (circuits having the shortest access times) cost more than slower DRAMs. Thus, the access times of DRAMs are typically matched with the clock rate of other components in a typical computer system. Generally DRAMs are operated asynchronously with respect to the rest of the computer system and the RAS signal is generated by a logic circuit that is initiated with a RAS_ON signal, for example, and terminated by a RAS_OFF signal. The RAS_OFF signal may be generated by a selected output tap of a delay line (not shown) which has the RAS_ON signal as an input. The output tap of the delay line is selected in accordance with the duration of the RAS signal required to satisfy the access time of the DRAM being used. In conventional RAS generation circuits, the RAS_ON and RAS_OFF signals are provided as inputs to an asynchronous circuit having the testability problems described above. FIG. 9 illustrates an exemplary asynchronous circuit in accordance with the present invention that generates a RAS output signal in response to a RAS_ON input signal and in response to a selectable one of a first RAS_OFF_1 input signal and a second RAS_OFF_2 input signal. For example, the RAS_OFF_1 input signal and the RAS_OFF_2 input signal can be connected to two different output taps of a conventional delay line (not shown) driven by the RAS_ON input signal.

The circuit 900 is responsive to a first input to change the output from a low to high level and is responsive to a selected one of second and third inputs to change the output back to a low level. The selected one of the second and third inputs is determined by a mode control signal, which, in a first state selects the second input and in a second state selects the third input.

The circuit 900 comprises a first flip-flop 910, a second flip-flop 912, and a third flip-flop 914. The three flip-flops 910, 912, 914 are illustrated as toggle flip-flops, as described above. The first flip-flop 910 has a toggle enable input TEA, a toggle input TA, a reset input RA, and a QA output. The second flip-flop 912 has a TEB input, a TB input, a RB input, and a QB output. The third flip-flop 914 has a TEC input, a TC input, a RC input and a QC output.

The circuit 900 further includes a first AND-gate 916 having first and second inputs and an output; a second AND-gate 918 having first and second inputs and an output; an exclusive-OR (XOR) gate 920 having first, second, and third inputs and an output; and a first inverter 922 having an input and an output. (As discussed above in connection with FIG. 5, the three-input exclusive-OR gate 920 may be implemented by a pair of two-input exclusive-OR gates.) The circuit 900 further includes a third AND-gate 924 having first and second inputs and an output, and a second inverter 926 having an input and an output.

The TA input of the first flip-flop 910 is connected to an INPUTA signal input line 930 (parenthetically labeled as RAS_ON). The TB input of the second flip-flop 912 is connected to an INPUTB signal input line 932 (parenthetically labeled as RAS_OFF_1). The TC input of the third flip-flop 914 is connected to an INPUTC signal input line 934 (parenthetically labeled as RAS_OFF_2). The RA, RB, RC inputs of flip-flops 910, 912, 914, respectively, are all connected to a common RESET signal input line 936.

The QA output of the first flip-flop 910 is connected to the first input of the XOR-gate 920 via a signal line 940. The QB output of the second flip-flop 912 is connected to the second input of the XOR-gate 920 via a signal line 942. The QC output of the third flip-flop 914 is connected to the third input of the XOR-gate 920 via a signal line 944. The output of the XOR-gate 920 is an OUT signal on an output signal line 946 (parenthetically labeled as RAS). The OUT signal is connected to the RAS inputs of a bank 948 of DRAMs (shown in dashed lines).

The OUT signal 946 is further connected to the input of the first inverter 922, to the second input of the first AND-gate 916, and to the second input of the second AND-gate 918. The output of the first inverter 922 is connected to the second input of the third AND-gate 924. The TEA input of the first flip-flop 910 is connected to the output of the third AND-gate 924 via a TEA signal line 948. The TEB input of the second flip-flop 912 is connected to the output of the first AND-gate via a TEB signal line 950. The TEC input of the third flip-flop 914 is connected to the output of the second AND-gate via a TEC signal line 952.

The first input of the third AND-gate 924 is connected to receive a BANK_ENABLE signal on a signal line 960. The first input of the first AND-gate 916 is connected to receive a RAS_OFF_MODE signal on a signal line 962. The input of the second inverter 926 is also connected to receive the RAS_OFF_MODE signal on the signal line 962. The first input of the second AND-gate 918 is connected to receive the output of the second inverter 926 on a signal line 964 and thus receives a signal having the opposite logic state as the RAS_OFF_MODE signal.

The three-input XOR-gate 520 will have a high level output when it detects an odd number of high level inputs and a low level when it detects an even number of high level inputs.

When the BANK_ENABLE signal is active high, the circuit 900 is enabled to respond to the RAS_ON signal (INPUTA). When the BANK_ENABLE signal is low, the circuit 900 is disabled and will not respond to the RAS_ON signal. External logic (not shown) can control the BANK_ENABLE signals applied to a plurality of banks of DRAMs, such as the bank 948, that incorporate the present invention For example, when data is to be read from or written to a particular bank, only one BANK_ENABLE signal will be activated On the other hand, when memory is to be refreshed, the BANK_ENABLEs for the plurality of banks can be enabled at once to refresh all the banks at once.

The RAS_OFF_MODE signal determines whether the circuit 900 is responsive to the RAS_OFF_1 signal (INPUTB) or to the RAS_OFF_2 signal (INPUTC).

When the RAS_OFF_MODE signal is active high, the first AND-gate 916 is enabled when the OUT signal is high so that the RAS_OFF_1 signal on the INPUTB signal line 932 deactivates the OUT signal. The output of the second inverter 926 on the line 964 is low so that the second AND-gate 918 is disabled and the RAS_OFF_2 signal on the INPUTC signal line 934 has no effect on the operation of the circuit 900. On the other hand, when the RAS_OFF_MODE signal is low, the circuit 900 is responsive to the RAS_OFF_2 signal and is not responsive to the RAS_OFF_1 signal. As discussed above, the RAS_OFF_1 signal and the RAS_OFF_2 signals are advantageously two different taps from a delay line so that when the RAS_OFF_MODE signal is high, the RAS_OFF_1 signal terminates the OUT (RAS) signal, and, when the RAS_OFF_MODE signal is low, the RAS_OFF_2 signal terminates the OUT (RAS) signal.

Figure 9:
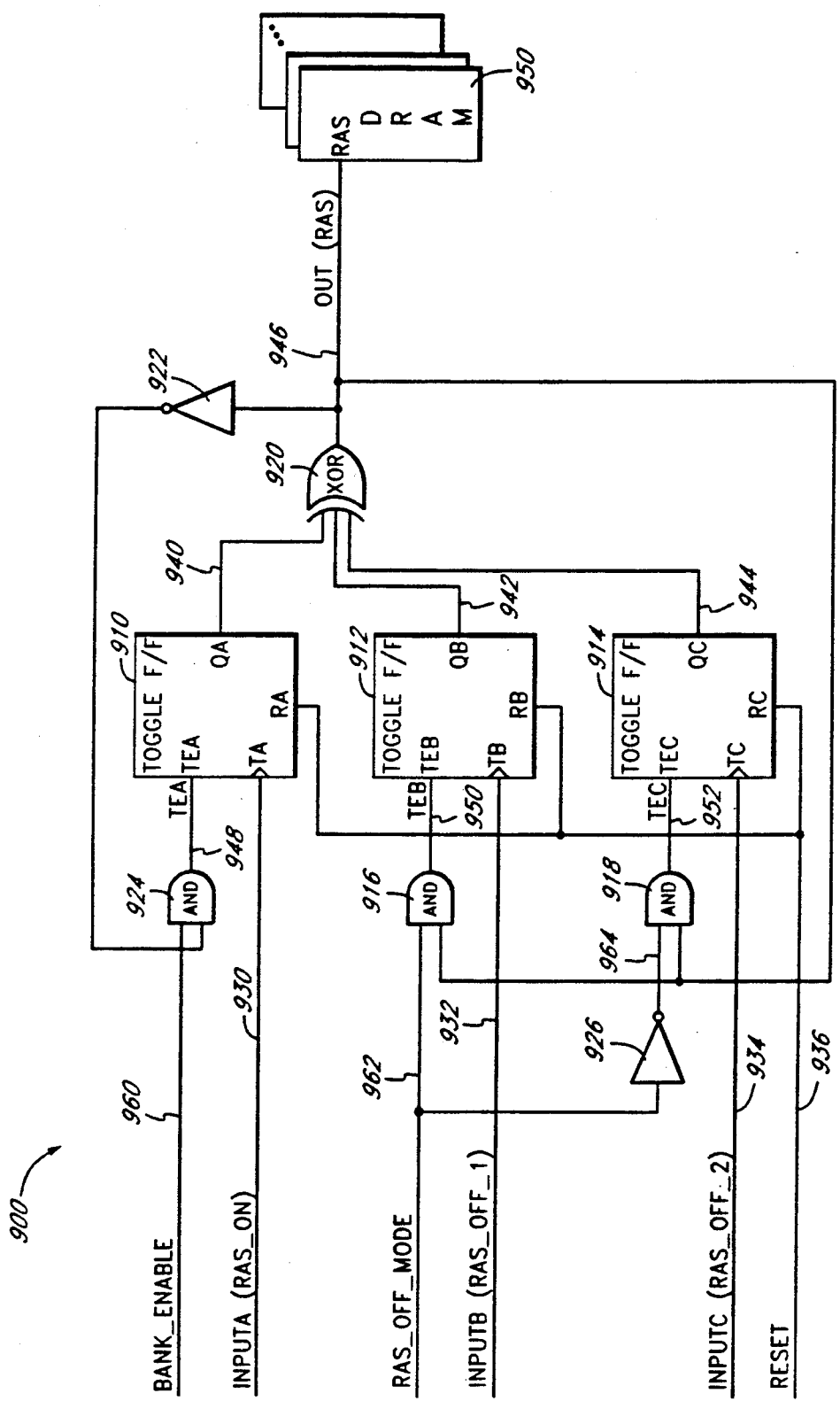
FIG. 9 illustrates a fourth embodiment of the present invention in which an output signal can be activated by a first input signal and in which the output signal is deactivated by a selected one of a second input signal and a third input signal in accordance with the state of a mode selection signal.
Figure 10A:
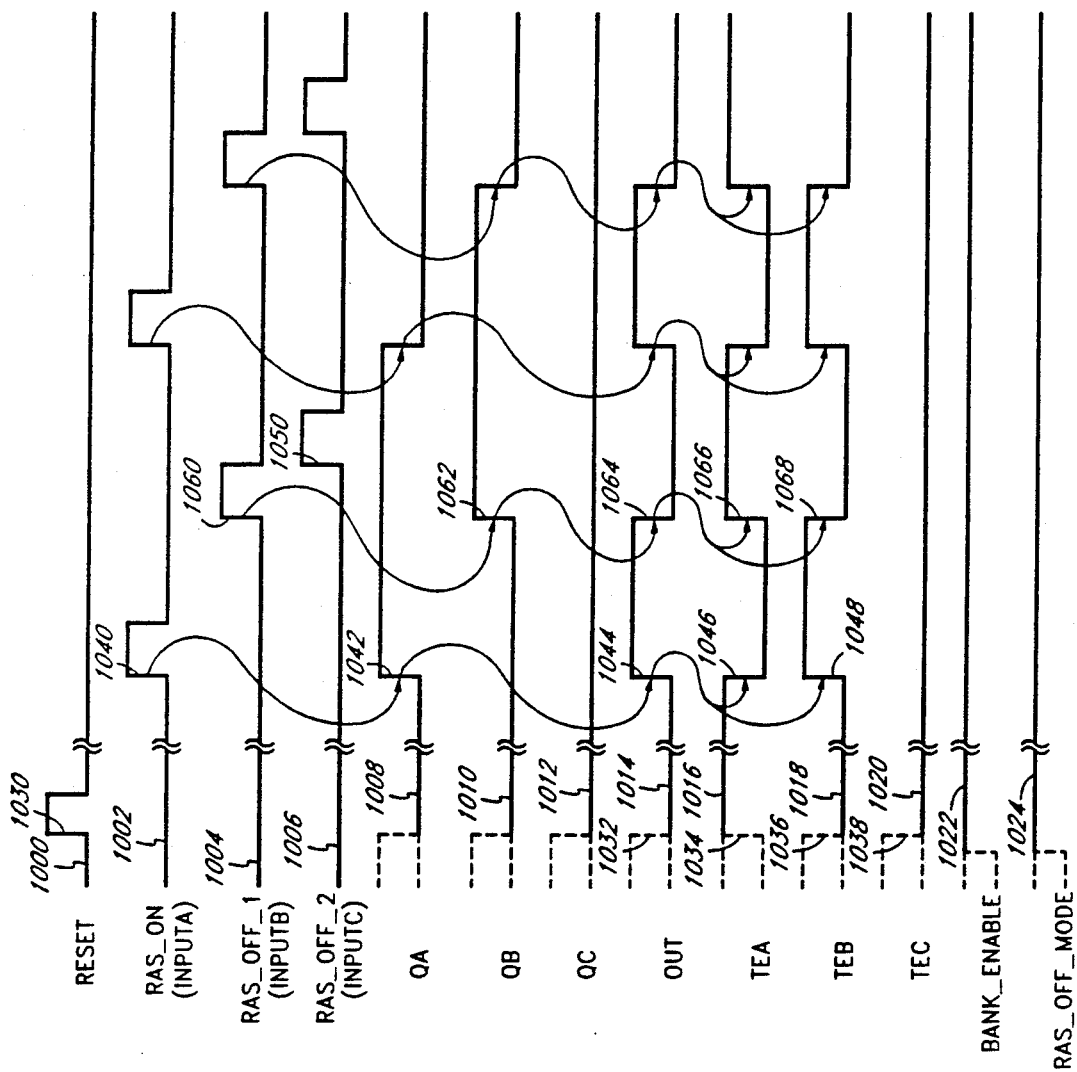
FIG. 10A illustrates timing diagrams of signals associated with the embodiment of FIG. 9 showing the relationship between the input signals and the output signal when the mode selection signal has a first high state.
Figure 10B:
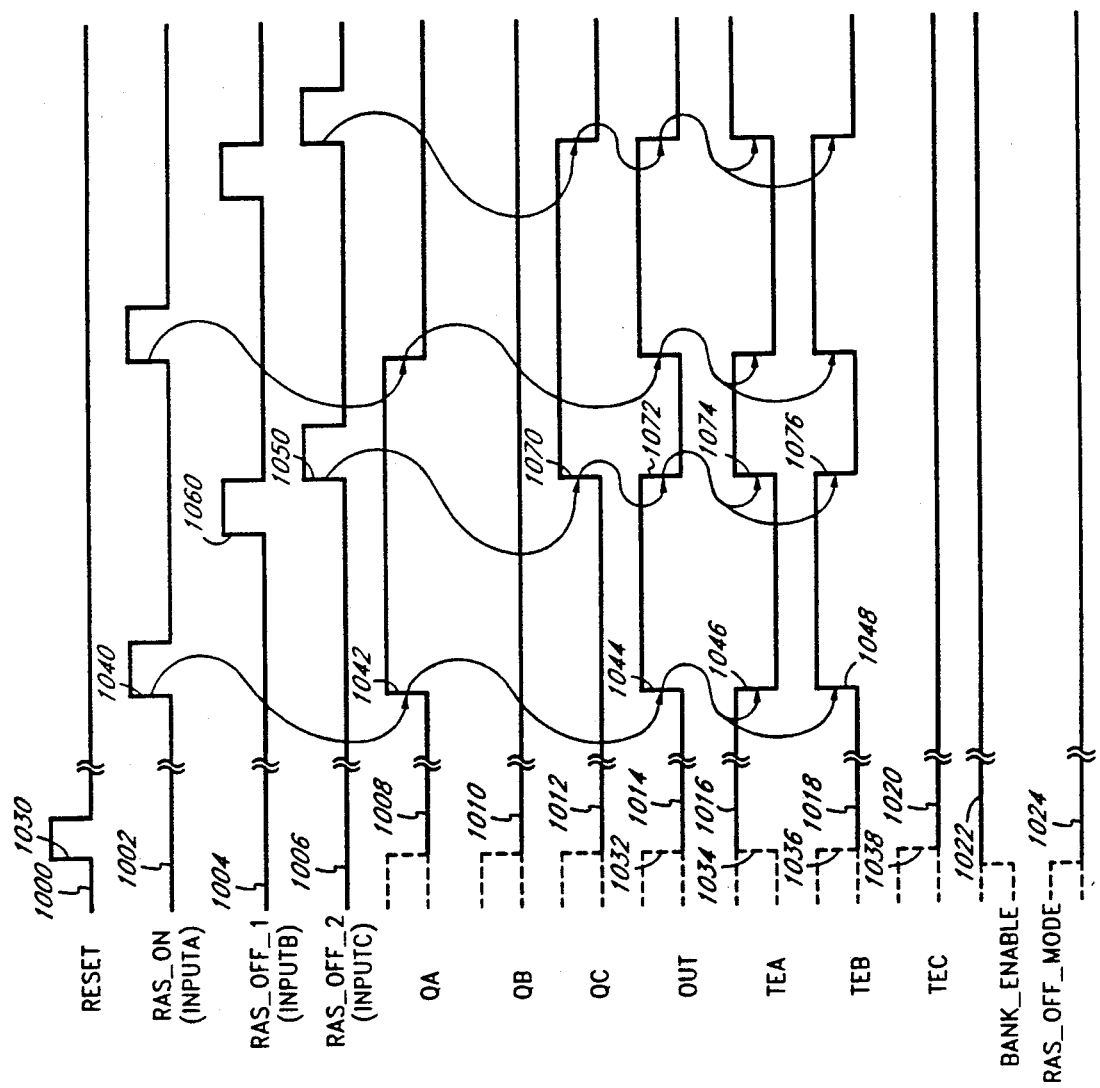
FIG. 10B illustrates timing diagrams of signals associated with the embodiment of FIG. 9 showing the relationship between the input signals and the output signal when the mode selection signal has a second low state.

The above-described operation of the embodiment of FIG. 9 is illustrated by the timing diagrams in FIGS. 10A and 10B. Timing diagrams 1000, 1002, 1004, 1006, 1008, 1010, 1012, 1014, 1016, 1018, 1020, 1022 and 1024 represent the RESET signal, the INPUTA (RAS_ON) signal, the INPUTB (RAS_OFF_1) signal, the INPUTC (RAS_OFF_2) signal, the QA signal, the QB signal, the QC signal, the OUT (RAS) signal, the TEA signal, the TEB signal, the TEC signal, the BANK_ENABLE signal and the RAS_OFF_MODE signal, respectively.

In FIGS. 10A and 10B, the BANK_ENABLE signal is illustrated as being constantly active high so that the circuit 900 will respond to the RAS_ON signal input, as discussed below. In FIG. 10A, the RAS_OFF_MODE signal is high so that the circuit 900 is responsive to the RAS_OFF_1 signal. In FIG. 10B, the RAS_OFF_MODE signal is low so that the circuit 900 is responsive to the RAS_OFF_2 signal As further illustrated in both FIGS. 10A and 10B, the circuit 900 is initialized by a low-to-high transition of the RESET input signal (transition 1030). The first, second and third flip-flop outputs QA, QB, and QC respectively are all forced to a low logic level. This causes all three inputs of the XOR-gate 920 to be forced to a low logic level and the output signal on the OUT (RAS) signal line 946 will be forced low (transition 1032). The low logic level OUT signal drives the output of the first inverter 922 high, and, because the BANK_ENABLE signal is high, both inputs to the third AND-gate 924 are high to drive the TEA signal line 948 high (transition 1034). The low logic level OUT signal causes both the AND-gate outputs TEB and TEC to be forced to a low logic level (transitions 1036 and 1038, respectively).

After initialization, only the first flip-flop 910 is enabled to toggle in response to an asynchronous input since the TEA signal is at a high logic level and the TEB and TEC signals are at a low logic level. A low-to-high transition on the RAS_ON (INPUTA) signal line (transition 1040) causes a low-to-high transition (transition 1042) on the QA output signal line 940. The first input of the XOR-gate 520 has a high logic level and the other two inputs remain at a low logic level so the RAS output on the OUT signal line is forced high (transition 1044).

The high logic level OUT (RAS) signal causes a high-to-low transition (transition 1046) on the output of the inverter 922 and thus on the TEA signal line 948 from the third AND-gate 924. This disables further transitions on the INPUTA signal line from toggling the first flip-flop 910. Referring first to FIG. 10A, since both the OUT signal and the RAS_OFF_MODE signal are now at a high logic level, the output of the first AND-gate 916 is forced high (transition 1048) on the TEB signal line 950. Thus, the second flip-flop 912 is enabled to toggle in response to an asynchronous RAS_OFF_1 signal input on the INPUTB signal line. The third flip-flop 914 remains disabled since the first input to the second AND-gate 918 is low, and the TEC input on the signal line 952 remains at a low logic level. Thus, any low-to-high transition of the RAS_OFF_2 signal on the INPUTC signal line (e.g., transition 1050) to the third flip-flop is ignored.

When the RAS_OFF_1 signal on the INPUTB signal line 932 has a low-to-high transition (transition 1060), the QB signal is forced high (transition 1062) forcing the OUT (RAS) signal low (transition 1064) since two of the three inputs to the XOR-gate 920 are at a high logic level. The low logic level OUT signal drives the TEA signal to a high logic level (transition 1066) and forces the TEB signal to a low logic level (transition 1068). Therefore, the first flip-flop 910 is again enabled at this time. As long as the RAS_OFF_MODE signal remains high, the RAS_ON input signal to the first flip-flop 910 will activate the OUT (RAS) signal and the RAS_OFF_1 input signal to the second flip-flop 912 will deactivate the OUT (RAS) signal.

Referring now to FIG. 10B, when the RAS_OFF_MODE signal is low, the second flip-flop 9212 is constantly disabled, and the third flip-flop 914 is enabled whenever the RAS_ON input signal activates the OUT (RAS) signal. Thus, any transition in the RAS_OFF_1 signal (e.g., transition 1060) is ignored and a transition in the RAS_OFF_2 signal (transition 1050) deactivates the OUT (RAS) signal.

It can be seen from FIGS. 10A and 10B that by selectively activating the RAS_OFF_MODE signal, the circuit 900 can be made responsive to two different RAS_OFF signals. For example, the first RAS_OFF_1 signal may advantageously be connected to an output tap of a delay line (not shown) that generates an active signal 80 nanoseconds after the leading edge of the RAS_ON signal and the RAS_ON_2 signal may advantageously be connected to an output tap of the same delay line that generates an active signal 100 nanoseconds after the leading edge of the RAS_ON signal. Thus, the RAS_OFF_MODE signal can be activated (e.g., by a switch or a mode configuration register) when the DRAM 548 comprises circuits having 80-nanosecond or better access times, and the RAS_OFF_MODE signal can be deactivated when the DRAM 548 comprises circuits having slower access times. The RAS_OFF selections can be extended by including additional RAS_OFF flip-flops connected to additional taps of the delay line and enabled by additional RAS_OFF_MODE selection signals (not shown).

It can be seen that the present invention enables an asynchronous circuit to be implemented using clocked logic circuits. Thus, various circuit parameters (e.g., propagation delays, etc.) can be tested using conventional synchronous testing techniques. One of the advantages to clocked logic circuits is the ability to separate, in a design sense, the functional behavior of the circuits from the timing information associated with state changes and associated with delays between the inputs and outputs. That is, a complex logic circuit can be used to generate a control signal in response to a number of changing input signals. The control signal can exhibit a number of interim states as the input signals change so long as the control signal is stable for a sufficient time to satisfy the setup and hold times to the clocked logic circuits. The present invention, described above in connection with the preferred embodiments, provides the benefits of clocked logic circuits in asynchronous circuits in that the control signal enable signals (e.g., TEA, TEB, etc.) are isolated from the control signals themselves (e.g., INPUTA, INPUTB, etc.).

An additional benefit of the present invention is that the propagation delays in the logic that generate the control signal enable signals (TEA, TEB, etc.) are isolated from the propagation delays in the control signal itself. Thus, any additional complexity in the combinatorial feedback logic circuits that generate the control signal enable signals does not add to the propagation delays from the control signal inputs to the circuit outputs. Basically, each control signal input (INPUTA, INPUTB, etc.) is applied to the clock input of a flip-flop, the output of which is fed through one or two levels of exclusive-OR gates to the output. The propagation delays through the flip-flops and the exclusive-OR gates are readily predictable and measurable, thus enhancing the testability characteristics of the asynchronous circuits of the present invention Furthermore, the propagation delays through parallel asynchronous circuits of the present invention will be substantially equal when constructed in typical VLSI circuit technology since differences in the combinatorial feedback logic will not affect the input-to-output propagation paths. Thus, all the input-to-output propagation delays of the parallel circuits can be compared to a single range of acceptable characteristics rather than having to establish a set of test parameters for each circuit These advantages of the asynchronous circuits of the present invention are similar to the advantages of classical synchronous circuits.

Although described in view of the foregoing embodiments responsive to 2, 3 and 4 inputs, the present invention can be expanded to additional inputs and more complex logic functions using the toggle flip-flop techniques. It should be further understood that although the present invention has been described with respect to changes initiated by transitions of the input signals from low logic levels to high logic levels, the opposite transitions can also be used (for example, by suitable inversion of the input signals).

What is claimed is:

1. A circuit that receives asynchronous input signals and generates an active asynchronous output signal, said circuit comprising: a first toggle flip-flop, said first toggle flip-flop
having a first enable input, a first clock input, and a first output, said first output of said first toggle flip-flop changing logic states upon occurrence of a predetermined edge of a first asynchronous input signal applied to said first clock input only when enabled by a first enable signal applied to said first enable input;
a second toggle flip-flop, said second toggle flip-flop having a second enable input, a second clock input, and a second output, said second output of said second toggle flip-flop changing logic states upon occurrence of a predetermined edge of a second asynchronous input signal only applied to said second clock signal only when enabled by a second enable signal applied to said second enable input; and
a logic circuit responsive to said outputs of said flip-flops wherein said logic circuit controls the logic level of said first and second enable signals of said flip-flops such that said first flip-flop is enabled prior to occurrence of said predetermined edge of said first asynchronous input signal and disabled after occurrence of said predetermined edge of said first asynchronous input signal, and wherein said second flip-flop is disabled until occurrence of said predetermined edge of said first asynchronous input signal and enabled after occurrence of said predetermined edge of said first asynchronous input signal, said second flip-flop being subsequently disabled and said first flip-flop being enabled upon occurrence of said predetermined edge of said second asynchronous input signal, wherein said logic circuit further generates said active asynchronous output signal between said predetermined edge of said first asynchronous input signal and said predetermined edge of said second asynchronous input signal.

2. The circuit defined in claim 1, wherein a reset signal is applied to a reset input of said first and second flip-flops to initialize said circuit, said reset signal further enabling said first flip-flop and disabling said second flip-flop.

3. The circuit defined in claim 1, further including a third toggle flip-flop having a third enable input, a third clock input, and a third output, said third output of said third toggle flip-flop changing logic states upon occurrence of a predetermined edge of a third asynchronous input signal applied to said third clock input only when enabled by a third enable signal applied to said third enable input, said logic circuit further controlling the logic level of said third enable signal such that said third flip-flop and said second flip-flop are alternately enabled after occurrence of said predetermined edge of said first asynchronous input signal, said third flip flop disabled after occurrence of said predetermined edge of said third asynchronous input signal, wherein said logic circuit is responsive to the outputs of said flip-flops such that said active asynchronous output signal is alternately generated (1) between said predetermined edge of said first asynchronous input signal and said predetermined edge of said second asynchronous input signal and (2) between said predetermined edge of said first asynchronous input signal and said predetermined edge of said third asynchronous input signal.

4. The circuit defined in claim 3, wherein a reset signal is applied to a reset input of said first, second, and third flip-flops to initialize said circuit, said reset signal further enabling said first flip-flop and disabling said second and third flip-flops 5. The circuit defined in claim 1, further comprising:
a third toggle flip-flop having a third enable input, a third clock input, and a third output, said third output of said third toggle flip-flop changing logic states upon occurrence of a predetermined edge of a third asynchronous input signal applied to said third clock input only when enabled by a third enable signal applied to said third enable input; and
a fourth toggle flip-flop having a fourth enable input, a fourth clock input, and a fourth output, said fourth output of said fourth toggle flip-flop changing logic states upon occurrence of a predetermined edge of a fourth asynchronous input signal applied to said fourth clock input only when enabled by a fourth enable signal applied to said fourth enable input, said logic circuit further controlling the logic levels of said first, second, third and fourth enable signals such that said first and third flip-flops are initially enabled prior to the occurrence of said predetermined edge of said first asynchronous input signal and disabled upon occurrence of said predetermined edge of said first asynchronous input signal, said occurrence of said predetermined edge of said first asynchronous input signal further enabling said second flip-flop, said first and third flip-flops enabled upon occurrence of said predetermined edge of said second asynchronous input signal, said occurrence of said predetermined edge of said second asynchronous input signal further disabling said second flip flop, said first and third flip-flops also disabled upon occurrence of said predetermined edge of said third asynchronous input signal, said occurrence of said predetermined edge of said third asynchronous input signal further enabling said fourth flip-flop, said first and third flip-flops also enabled upon occurrence of said predetermined edge of said fourth asynchronous input signal, said occurrence of said predetermined edge of said fourth asynchronous input signal further disabling said fourth flip-flop, wherein said logic circuit further generates said active asynchronous output signal when said second flip-flop or said fourth flip-flop is enabled.

6. The circuit defined in claim 4, wherein a reset signal is applied to a reset input of said first, second, third, and fourth flip-flops to initialize said circuit, said reset signal further enabling said first and third flip-flops, and disabling said second and fourth flip-flops.

7. The circuit defined in claim 1, further including a third toggle flip-flop having a third enable input, a third clock input, and a third output, said third output of said third toggle flip-flop changing logic states upon occurrence of a predetermined edge of a third asynchronous input signal applied to said third clock input only when enabled by a third enable signal applied to said third enable input, said logic circuit further responsive to a mode selection signal having first and second states, said logic circuit controlling the logic level of said second and third enable signals such that:

said second flip-flop is enabled after occurrence of said predetermined edge of said first asynchronous input signal only when said mode selection signal has said first state so that said output signal is active between said predetermined edge of said first asynchronous input signal and said predetermined edge of said second asynchronous input signal; and said third flip-flop is enabled after occurrence of said predetermined edge of said first asynchronous input signal only when said mode selection signal has said second state so that said output signal is active between said predetermined edge of said first asynchronous input signal and said predetermined edge of said third asynchronous input signal.

8. The circuit defined in claim 7, wherein a reset signal is applied to a reset input of said first, second, and third flip-flops to initialize said circuit, said reset signal further enabling said first flip-flop and disabling said second and third flip-flops.

* * * * *